United States Patent
Lee et al.

(10) Patent No.: US 11,756,789 B2
(45) Date of Patent: Sep. 12, 2023

(54) SEMICONDUCTOR MANUFACTURING METHOD AND APPARATUS THEREOF

(71) Applicant: TAIWAN SEMICONDUCTOR MANUFACTURING COMPANY LTD., Hsinchu (TW)

(72) Inventors: Yung-Yao Lee, Hsinchu County (TW); Wen-Chih Wang, New Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 64 days.

(21) Appl. No.: 17/561,010

(22) Filed: Dec. 23, 2021

(65) Prior Publication Data

US 2022/0115229 A1 Apr. 14, 2022

Related U.S. Application Data

(62) Division of application No. 16/445,674, filed on Jun. 19, 2019, now Pat. No. 11,244,827.

(Continued)

(51) Int. Cl.
| | |
|---|---|
| *H01L 21/027* | (2006.01) |
| *G03F 1/38* | (2012.01) |
| *G03F 7/095* | (2006.01) |
| *G03F 1/70* | (2012.01) |
| *H01L 21/033* | (2006.01) |
| *H04B 10/43* | (2013.01) |
| *H01L 31/12* | (2006.01) |
| *G02B 6/42* | (2006.01) |

(Continued)

(52) U.S. Cl.
CPC ........ *H01L 21/0273* (2013.01); *G02B 6/4204* (2013.01); *G03F 1/38* (2013.01); *G03F 1/70* (2013.01); *G03F 7/095* (2013.01); *G03F 7/70033* (2013.01); *G03F 7/70716* (2013.01); *H01L 21/0274* (2013.01); *H01L 21/0332* (2013.01); *H01L 21/76816* (2013.01); *H01L 31/125* (2013.01); *H04B 10/43* (2013.01); *G01N 2021/95676* (2013.01)

(58) Field of Classification Search
CPC .... G01B 11/24; G01B 17/06; G01B 2210/56; G01B 21/08; G03F 9/7034; G03F 9/7026; G03F 7/7015; G03F 7/70008; G03F 1/38; G03F 7/095; G03F 1/70; G01N 29/00; G01N 2021/95676; H01L 22/12; H01L 21/0274; H01L 21/0273; H01L 21/0332; H01L 31/125; H01L 21/76816; H04B 10/43; G02B 6/4204
USPC .......................................................... 430/30
See application file for complete search history.

(56) References Cited

U.S. PATENT DOCUMENTS

| | | |
|---|---|---|
| 8,716,841 B1 | 5/2014 | Chang et al. |
| 8,736,084 B2 | 5/2014 | Cheng et al. |

(Continued)

*Primary Examiner* — Caleen O Sullivan
(74) *Attorney, Agent, or Firm* — WPAT LAW; Anthony King

(57) ABSTRACT

The present disclosure provides an apparatus for manufacturing a semiconductor structure. The apparatus includes a stage, an optical transceiver over the stage, configured to obtain a first profile of a first surface of a substrate, an acoustic transceiver over the stage, configured to obtain a second profile of a top surface of a photo-sensitive layer over the substrate, wherein the stage is adapted to be displaced based on the first profile and the second profile.

20 Claims, 8 Drawing Sheets

Related U.S. Application Data

(60) Provisional application No. 62/751,164, filed on Oct. 26, 2018.

(51) Int. Cl.
*H01L 21/768* (2006.01)
*G03F 7/20* (2006.01)
*G01N 21/956* (2006.01)
*G03F 7/00* (2006.01)

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,837,810 B2 | 9/2014 | Chen et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,134,633 B2 | 9/2015 | Lin et al. |
| 9,184,054 B1 | 11/2015 | Huang et al. |
| 9,230,867 B2 | 1/2016 | Cheng et al. |
| 9,256,123 B2 | 2/2016 | Shih et al. |
| 9,304,403 B2 | 4/2016 | Lin et al. |
| 9,404,743 B2 | 8/2016 | Chiu et al. |
| 9,529,268 B2 | 12/2016 | Chang et al. |
| 9,548,303 B2 | 1/2017 | Lee et al. |
| 11,244,827 B2 * | 2/2022 | Lee ................ G01N 29/00 |

* cited by examiner

SEMICONDUCTOR MANUFACTURING METHOD AND APPARATUS THEREOF

CROSS REFERENCE TO RELATED APPLICATIONS

This application is a divisional application of prior-filed U.S. application Ser. No. 16/445,674, filed Jun. 19, 2019, and claims the benefit of prior-filed provisional application with application No. 62/751,164, filed Oct. 26, 2018.

BACKGROUND

A lithographic apparatus is a machine that applies a desired pattern onto a semiconductor substrate, such as a silicon wafer. A lithographic apparatus can be used, for instance, in the manufacture of integrated circuits (ICs). In such a case, a reticle may be used to generate a circuit pattern on an individual layer of the IC. Transfer of the circuit pattern is typically via imaging onto a layer of photo-sensitive material (photo resist) provided on the semiconductor substrate.

The surface of the semiconductor substrate on which a pattern projected is usually not completely flat. Moreover, the surface of the photo resist provided on the semiconductor substrate is usually also not flat. Such variable substrate topography can show flatness and thickness variations of several microns, resulting incorrect projection of the pattern due to focus errors or imaging errors. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
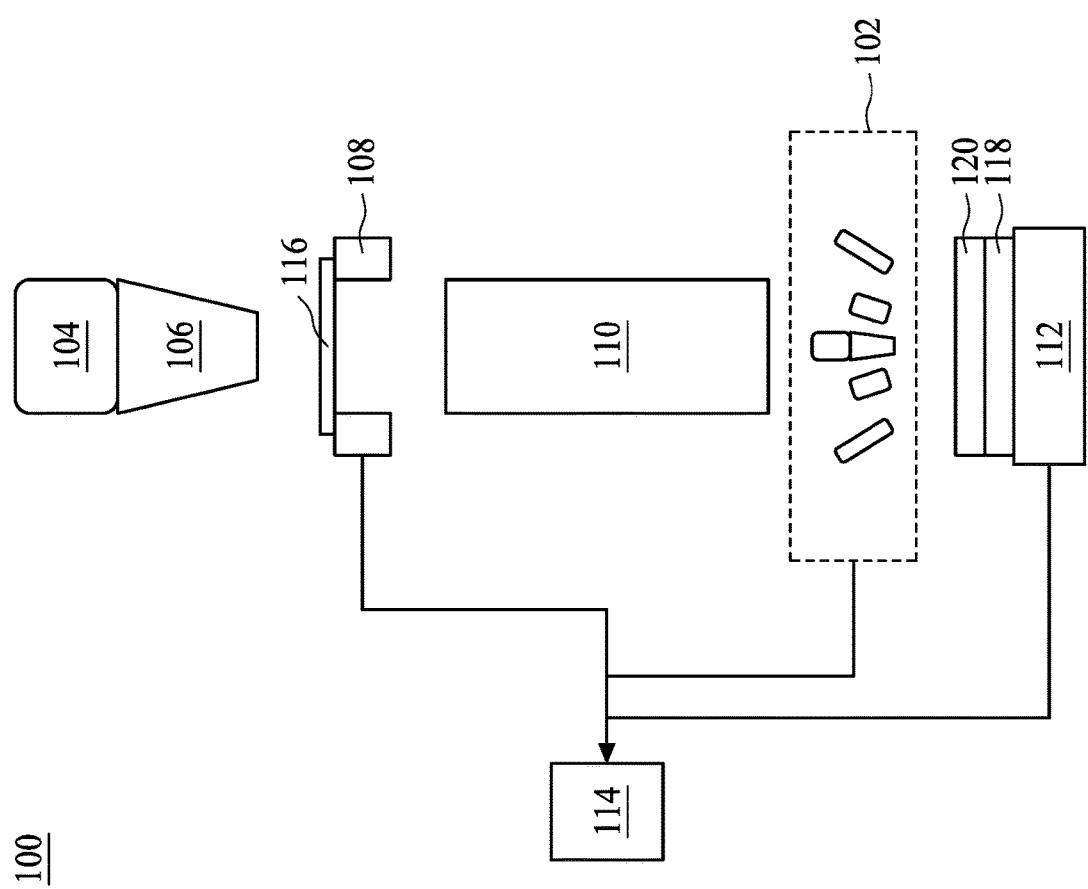
FIG. 1 is a schematic view of a lithography system with a transceiver module, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

When exposing a photo-sensitive layer to a radiation through a projection module, it is usually desired to ensure that focal plane of the irradiation light source lies on the middle plane of the photo-sensitive layer. The photo-sensitive layer is irradiated by scanning the photo-sensitive layer under the irradiation light source along a scanning direction. In each scanning operation, the photo-sensitive layer per se, as well as the semiconductor substrate below the photo-sensitive layer, may both possess thickness variations. Such variations may cause the focal plane divert from the middle plane of the photo-sensitive layer along the scanning operation, thereby affecting the quality of the exposure operation.

Therefore, the present disclosure provides a method for manufacturing a semiconductor structure. The method includes forming a photo-sensitive layer on a first surface of a semiconductor substrate. The photo-sensitive layer has a top surface. The method also includes obtaining a first profile of the first surface of the semiconductor substrate, and obtaining a second profile of the top surface of the photo-sensitive layer. The method also includes calculating a vertical displacement profile of the semiconductor substrate according to the first profile and the second profile. The method of the present disclosure can obtain the surface profiles, improving the scanning accuracy, and so as to dynamically focus the irradiation light source at a desired focal plane. The position of a stage bearing the semiconductor substrate may be adjusted according to the calculating results in order to focus the irradiation light source at a desired focal plane.

Referring to FIG. 1, FIG. 1 is a schematic view of a lithography system 100 with a transceiver module 102, in accordance with some embodiments of the present disclosure. In some embodiments, the lithography system 100 includes a light source 104 and an illumination module 106. In some embodiments, the lithography system 100 may further include a mask supporting structure 108 configured to support a mask 116 and connected to a processing unit 114 to accurately position the mask 116 with respect to a projection module 110. In some embodiments, the lithography system 100 may further include a substrate stage 112 configured to support a semiconductor substrate 118 and connected to the processing unit 114 to accurately position the semiconductor substrate 118 with respect to the projection module 110. In some embodiments, the projection module 110 is configured to image a pattern imparted to a radiation emitted from the light source 104 by the mask 116 onto a photo-sensitive layer 120 formed on the semiconductor substrate 118.

In some embodiments, the light source 104 provides radiation energy. The terms "radiation" and "light" used herein encompass all types of electromagnetic radiation, including ultraviolet (UV), deep UV (DUV), and extreme UV (EUV) radiation, as well as particle beams, such as ion beams or electron beams.

In some embodiments, the radiation source 104 may be a UV, DUV or EUV radiation source. For example, the radiation source 104 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; EUV radiation source with a wavelength of 13.5 nm; or other light sources having a desired wavelength. The EUV radiation source may be excited by a laser beam to generate a EUV beam. In some example embodiments, the EUV radiation source may include at least one of tin (Sn), xenon (Xe), titanium (Ti), or lithium (Li), which may be in a plasma state. The EUV radiation source of tin may generate the EUV having a wavelength of about 13.5 nm. In some embodiments, the radiation source 104 is capable of cross-linking the photo-sensitive layer 120.

The lithography system 100 may encompass various types of optical components, including refractive, reflective, and catadioptric optical components for directing, shaping, or controlling the beam of radiation.

In some embodiments, the illumination module 106 may have a single lens or multiple lenses and/or other lens components. For example, the illumination module 106 may include microlens arrays, shadow masks, and/or other structures. Each lens element may include a transmissive substrate and may further include a plurality of coating layers. The transmissive substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of radiation used in the lithography operation to minimize absorption and scattering. In some embodiments, the illumination module 106 guides a radiation to the mask 116.

The projection module 110 may have a single lens element or a plurality of lens elements such as those described above with respect to the illumination module 106. In some embodiments, the projection module 110 is configured to provide proper illumination to the photo-sensitive layer 120. The term "projection module" used herein should be broadly interpreted as encompassing various types of projection module, including refractive type, reflective type, and catadioptric type, as appropriate for the exposure radiation being used, or for other factors.

The substrate stage 112 secures and displaces the semiconductor substrate 118 in a way such that the focal plane of the radiation source 104 is located in a desired position, or at a desired height of a photo-sensitive layer 120 on the semiconductor substrate 118. In some embodiments, the substrate stage 112 includes a mechanism for vertical displacement so as to, for example, lift up or lower the semiconductor substrate 118 with respect to the radiation source 104. In some embodiments, the substrate stage 112 may include mechanisms for other motions, such as for rotating displacement, tilting displacement, or other motions during the exposing the photo-sensitive layer 120 to the radiation.

The substrate stage 112 is under control of the processing unit 114. The morphology information of the semiconductor substrate 118 and the photo-sensitive layer 120 is extracted through the transceiver module 102, and is sent to the processing unit 114 for further analysis.

The transceiver module 102 is connected to the processing unit 114. The processing unit 114 collects and analyses the morphology information, and generating one or more control parameters for controlling the substrate stage 112 in order to compensate the thickness variations of the semiconductor substrate 118 and the photo-sensitive layer 120. In some embodiments, the processing unit 114 may control the motions of the substrate stage 112 further according to other factors. In some embodiments, the processing unit 114 is also connected to the mask supporting structure 108, and controls the motions thereof.

In some embodiments, the processing unit 114 includes a calculator, a central processing unit (CPU), a computer, or other capable unit known in the arts. In some embodiments, the processing unit 114 is distributed in an intranet or a portion of the Internet coupled with a semiconductor manufacturer.

In some embodiments, other configurations and inclusion or omission of the lithography system 100 may be possible. For example, the lithography system 100 may include a chamber (not shown) to provide a vacuum environment or a low pressure environment with inert gas for protecting various components and the semiconductor substrate 118 to be processed.

Figure 2:
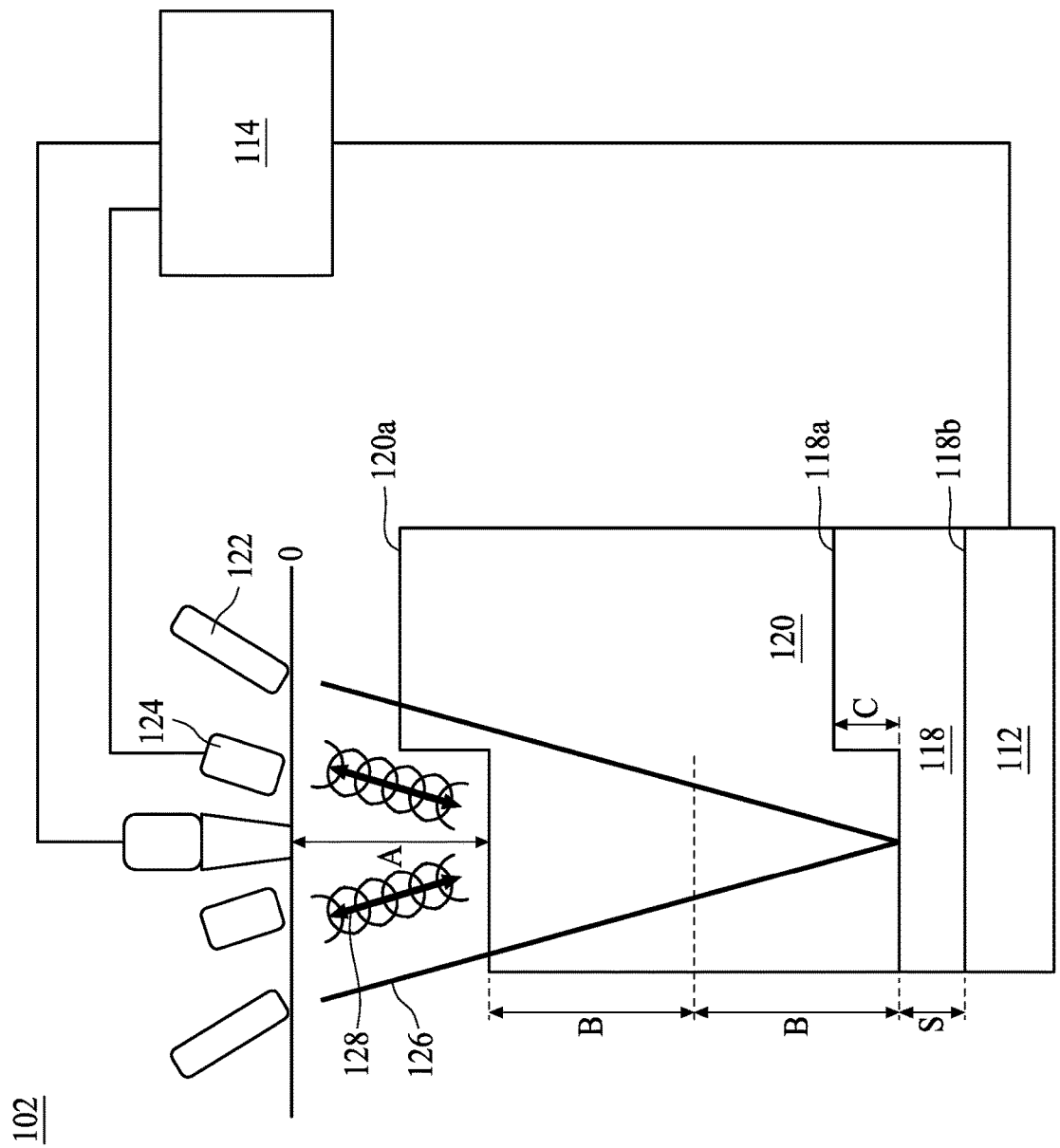
FIGS. 2 to 6 are schematic views of a transceiver module, in accordance with some embodiments of the present disclosure.

Referring to FIG. 2, FIG. 2 is a schematic view of the transceiver module 102, in accordance with some embodiments of the present disclosure. The transceiver module 102 includes an optical transceiver 122 connected to the processing unit 114. The transceiver module 102 further includes an acoustic transceiver 124 connected to the processing unit 114. Although only few transceivers are illustrated in figures for simplicity of explanation, in some embodiments, there may be a plurality of optical transceivers and a plurality of acoustic transceivers. The numbers, distributions, positions, structures, or other factors can be designed to meet the manufacturing requirements, but also achieve the invention purpose of the present disclosure. In some embodiments, the optical transceiver 122 and the acoustic transceiver 124 can be leveled at with a baseline (0). The baseline (0) is set to determine a desired focal plane for exposing the photo-sensitive layer 120. In other words, the optical signal and the acoustic signal are transmitted from the baseline (0).

The substrate stage 112 is under the optical transceiver 122 and the acoustic transceiver 124. The substrate stage 112 is also connected to the processing unit 114. The semiconductor substrate 118 is carried by the substrate stage 112. The photo-sensitive layer 120 is formed on a first surface 118a of the semiconductor substrate 118. The semiconductor substrate 118 further has a second surface 118b opposite to the first surface 118a.

In some embodiments, the semiconductor substrate 118 includes crystal silicon, polycrystalline silicon, amorphous silicon, germanium, and diamond. In some embodiments, the semiconductor substrate 118 includes SiC, GaAs, SiGe, GaAsP, AlInAs, AlGaAs, and GaInP, or a combination thereof.

The photo-sensitive layer 120 has a top surface 120a facing the transceiver module 102. In some embodiments, the photo-sensitive layer 120, such as a photo resist layer, is coated on the first surface 118a.

In some embodiments, the photo-sensitive layer 120 includes a polymeric material. In some embodiments, the photo-sensitive layer 120 includes a photoacid generator, dissolution inhibitor, and base quencher. The photo-sensitive layer 120 may further include a chromophore, a solvent, a surfactant, and/or crosslinker. In some embodiments, the photo-sensitive layer 120 includes a high viscosity photoresist material, such as a polyimide.

The photoresist material may be a negative photoresist or a positive photoresist. A positive photoresist material is more soluble in the exposed region. Thus, a developing operation removes the exposed portions of the positive photoresist material. On the other hand, a negative photoresist material is less soluble in the exposed regions. In some embodiments, the exposed region is cross-linked due to the radiation emitted from the light source 104.

In some embodiments, the optical transceiver 122 is configured to obtain a first profile of the first surface 118a of the semiconductor substrate 118. In some embodiments, the acoustic transceiver 124 is configured to obtain a second profile of the top surface 120a of the photo-sensitive layer 120. The processing unit 114 generates control signals for the motions of the substrate stage 112 according the first profile and the second profile. In some embodiments, the processing unit 114 calculates a vertical displacement profile of the semiconductor substrate 118 according the first profile and the second profile.

In some embodiments, the optical transceiver 122 and/or the acoustic transceiver 124 includes a pair of a transmitter and a receiver. In some embodiments, the optical transceiver 122 and/or the acoustic transceiver 124 has an integrated structure. In some embodiments, the optical transceiver 122 scans across the semiconductor substrate 118 to obtain the first profile of the first surface 118a. In some embodiments, the optical transceiver 122 and the acoustic transceiver 124 scan across the semiconductor substrate 118 simultaneously to obtain the first profile and the second profile.

In some embodiments, the first profile of the first surface 118a includes a first distance information between the optical transceiver 122 and the first surface 118a. In some embodiments, the second profile of the top surface 120a includes a second distance information between the acoustic transceiver 124 and the top surface 120a. For example, the second profile of the top surface 120a includes the illustrative length A. The first profile of the top surface 120a includes the illustrative length A+2B.

In some embodiments, the length A is defined as the distance between the acoustic transceiver 124 and the top surface 120a. In some embodiments, the length B can be predetermined and is defined or inputted to the processing unit 114 as a half thickness of the photo-sensitive layer 120. In some embodiments, the length S can be predetermined and is defined or inputted to the processing unit 114 as a thickness of the semiconductor substrate 118. In some embodiments, the length C can be measured by the optical transceiver 122 and is defined or inputted to the processing unit 114 as a deviation dimension of the thickness of the semiconductor substrate 118.

In some embodiments, the optical transceiver 122 emits a light 126 transparent to the photo-sensitive layer 120. In some embodiments, a spot size of the optical transceiver 122 is great than 1 micro meter. In some embodiments, the light 126 has a proper wavelength to monitor the morphology information of the first surface 118a. The light 126 is reflected from the first surface 118a, and received by the optical transceiver 122. In some embodiments, the optical transceiver 122 is a leveling sensor used in leveling methodology art.

In some embodiments, the acoustic transceiver 124 emits a matter wave 128. In some embodiments, the matter wave 128 has a frequency less than about 500 megahertz (MHz). In some embodiments, the matter wave 128 is reflected from the first surface 120a of the photo-sensitive layer 120 and received by the acoustic transceiver 124. In some embodiments, the acoustic transceiver 124 includes a piezoelectric element, which is able to be excited by an electrical impulse and to generate ultrasonic waves. The ultrasonic waves encounter the photo-sensitive layer 120 and reflected back. In some embodiments, the time interval is a few millionths of a second.

In some embodiments, the reflected waves possess distance information in a form of electrical signal, which can be further processed by the processing unit 114. In some embodiments, the first and/or second profile is reconstructed from the scanning information obtained through the transceiver module 102. In some embodiments, the acoustic transceiver 124, the optical transceiver 122, and/or the processing unit 114 is capable of calculating the distance, for example, using the mathematical relationship between the wave velocity and the time interval.

To determine a desired focal plane for exposing the photo-sensitive layer 120, the baseline (0) is set on the transceiver module 102. It is the goal that the middle plane of the photo-sensitive layer 120 lies at the desired focal plane, which means that the distance between the focal plane and the baseline is A+B. In some embodiments, the half thickness of the photo-sensitive layer 120, i.e., the length B, is predetermined. For example, the length B is the target thickness of the photo-sensitive layer 120. In some embodiments, when the photo-sensitive layer 120 is conformally formed on the semiconductor substrate 118, the length B is substantially constant over the semiconductor substrate 118.

Figure 3:
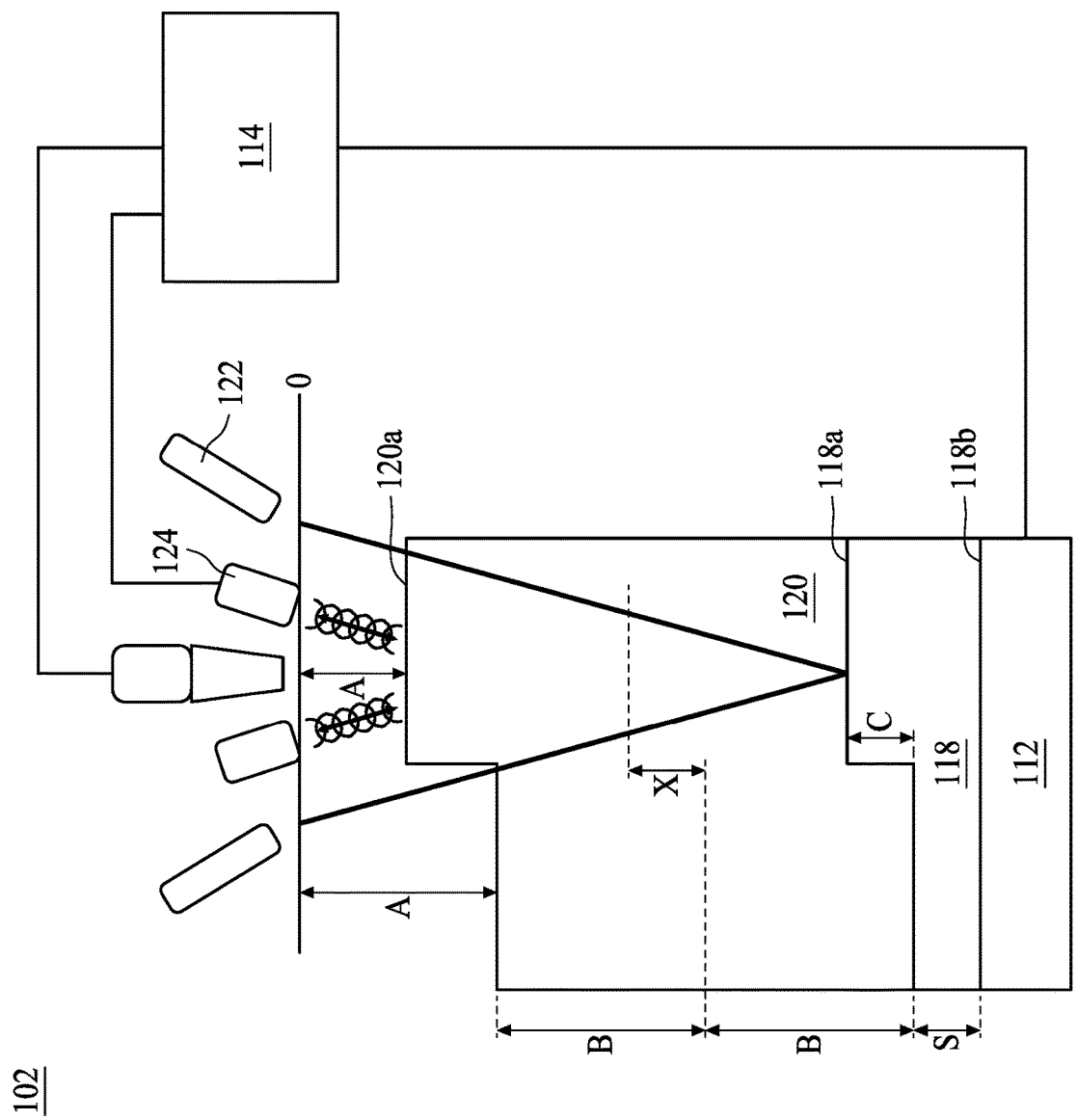

Referring to FIG. 3, FIG. 3 is a schematic view of the transceiver module 102, in accordance with some embodiments of the present disclosure. FIG. 2 and FIG. 3 can be viewed as a consecutive scanning operation, in which the transceiver module 102 moves from the left side to the right side over the semiconductor substrate 118.

In some embodiments, the first surface 118a is an even surface having a constant thickness S. In some embodiments, the first surface 118a is an uneven surface, and having some recessing portions and/or protruding portions. In some embodiments, the photo-sensitive layer 120 is coated on the semiconductor substrate 118 as a conformal layer, and therefore the top surface 120a is also uneven and protrudes up due to the uneven first surface 118a. In some embodiments, the uneven top surface 120a is resulted from the uneven first surface 118a, the thickness variation of the photo-sensitive layer 120, the material properties of the photo-sensitive layer 120, or other factors or their combination.

As shown in FIG. 3, the top surface 120a has a step structure from a side view, and the middle plane of the photo-sensitive layer 120 lifts up when the transceiver module 102 moves from the left side to the right side. As a result, the desired focal plane is changed. Under the condition that a focal length of the light source 104 remains constant along the scanning operation, the substrate stage 112 has to descend in order to keep the focal plane at the middle plane of the photo-sensitive layer 120.

In some embodiments, the acoustic transceiver 124 may be used to obtain the distance regarding the photo-sensitive layer 120, such as the length A. It is realized that the length A may be a variable value. The optical transceiver 122 may be used to obtain the distance regarding the semiconductor substrate 118, such as the distance between the first surface 118a and the baseline. After obtaining the scanning information, the processing unit 114 may calculate a vertical displacement profile based on the information to control the substrate stage 112.

In this situation, the distance between the baseline and the middle plane of the photo-sensitive layer 120 is shortened by, for example, distance X. The processing unit 114 then generates a control signal to the substrate stage 112 to descend the semiconductor substrate 118 by distance X. In this way, the middle plane of the photo-sensitive layer 120 is kept at the desired focal plane accurately and timely.

Figure 4:
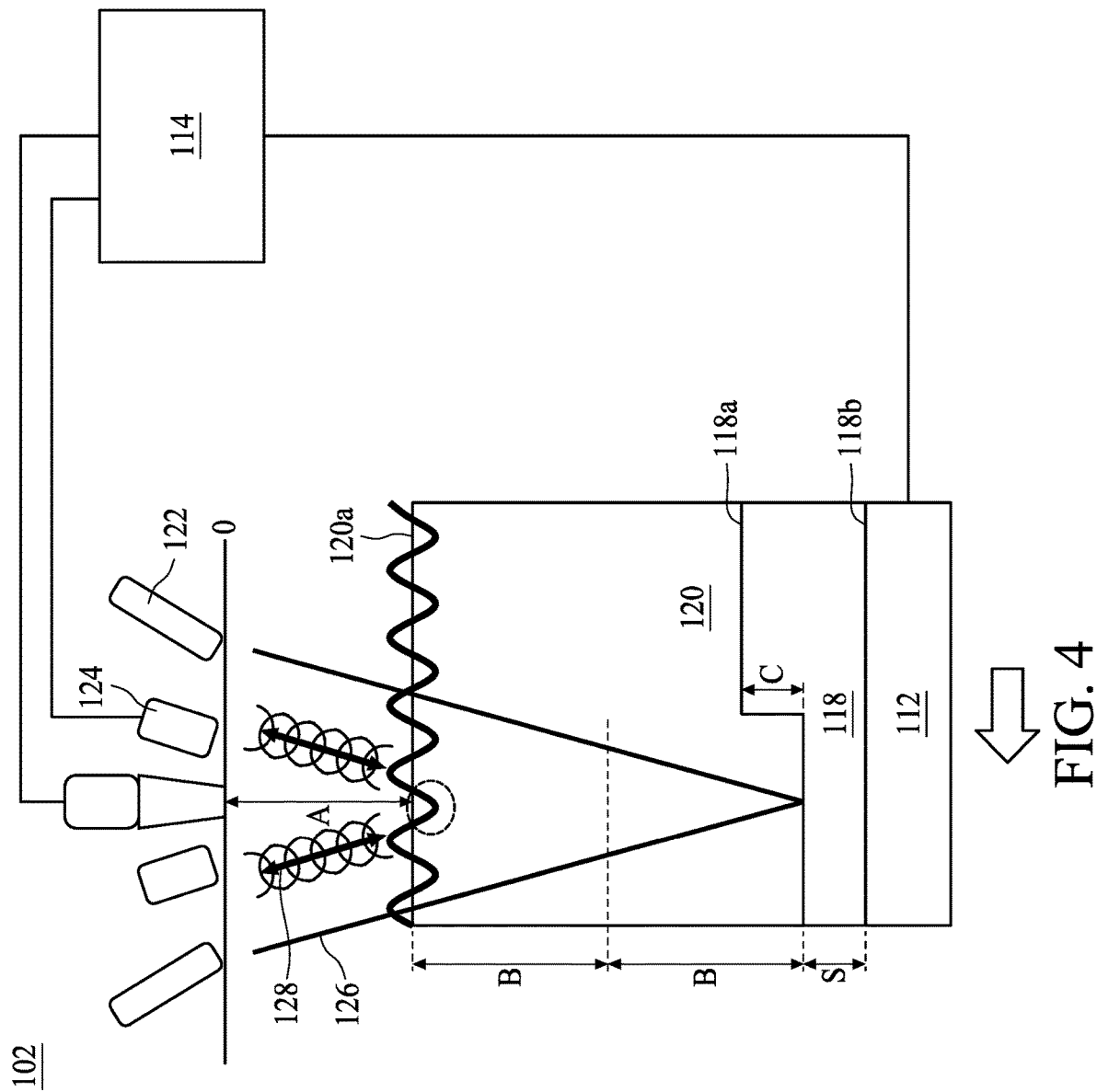

Referring to FIG. 4, FIG. 4 is a schematic view of the transceiver module 102, in accordance with some embodiments of the present disclosure. FIG. 4 is similar to FIG. 2 and FIG. 3, with the difference that FIG. 4 further illustrates the small scale variations at the top surface 120a of the photo-sensitive layer 120. The top surface 120a has a small scale profile variation. The photo-sensitive layer 120 in FIG. 2 and FIG. 3 is coated as a conformal layer, while the photo-sensitive layer 120 in FIG. 4 is a non-conformal layer whose top surface 120a is roughly flat regardless of the profile of the first surface 118a.

FIG. 4 illustrates an embodiment where the top surface 120a profile variation cannot be ignored, especially when the photo-sensitive layer 120 is a high viscosity photoresist material, such as polyimide. In some embodiments, when using polyimide as photo-sensitive layer 120, a thickness of the photo-sensitive layer at a center of the wafer can be about 0.5 micron greater than a thickness of the photo-sensitive layer at an edge of the wafer. Such variation entails about 4% to 5% of the predetermined photo-sensitive layer thickness. Failure to consider such photo-sensitive layer thickness variation may generate significant error in the course of determining desired focal plane.

Figure 5:
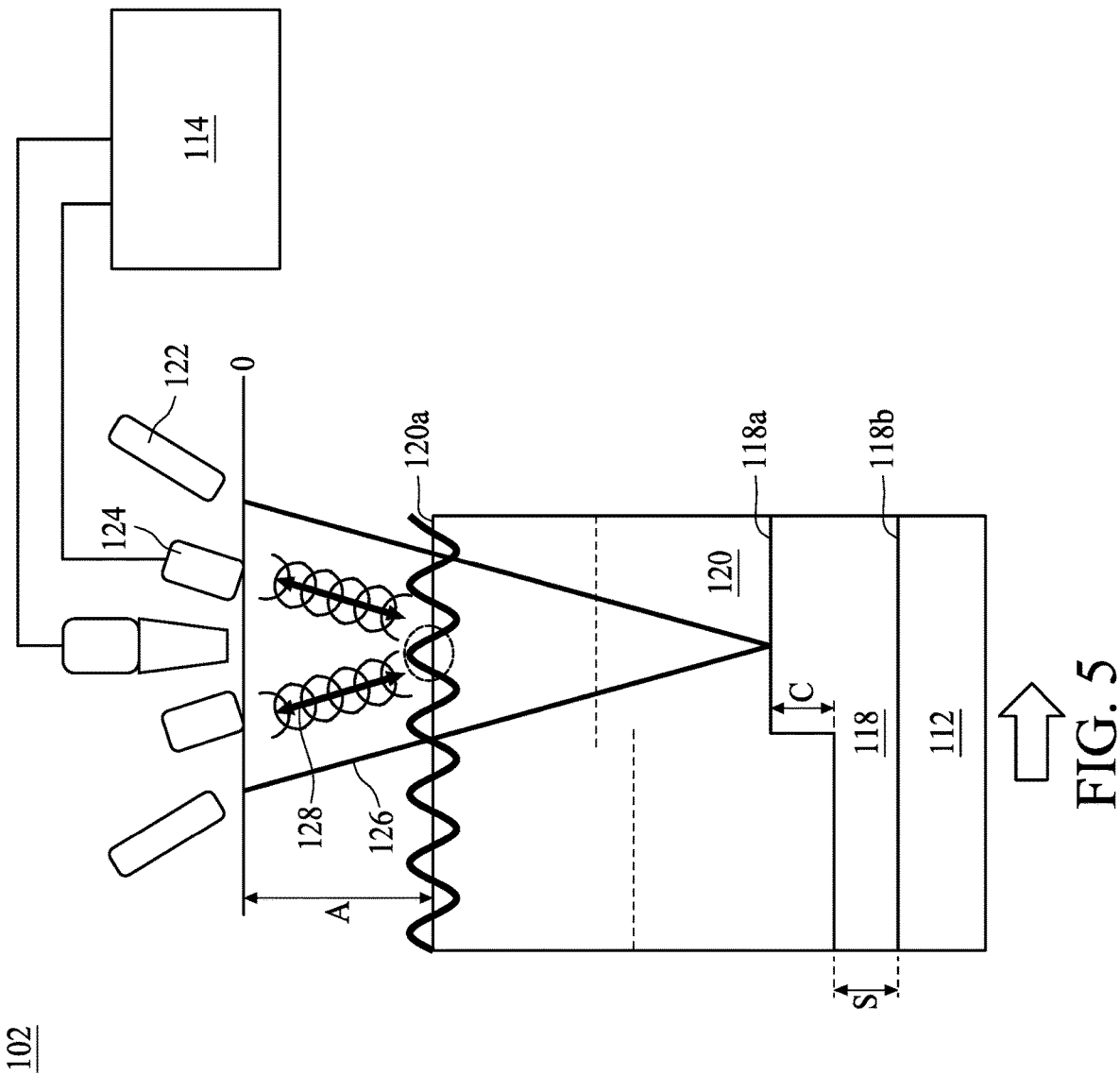

FIG. 4 illustrates a condition when the transceiver module 102 moves from the right side, as shown in FIG. 5, to the left side of the semiconductor substrate 118. In FIG. 4, the acoustic transceiver 124 may be used to obtain a distance information including a distance between the acoustic transceiver 124 and the top surface 120a along the scanning direction. Meanwhile, the optical transceiver 122 may be used to obtain a distance information including a distance between the optical transceiver 122 and the top surface 118a along the scanning direction. After obtaining the distance information based on the measurement of the acoustic transceiver 124 and the optical transceiver 122 and transmitting such distance information to the processing unit 114, the processing unit 114 may calculate a vertical displacement profile based on such distance information to further actuate the substrate stage 112.

In a position at a local minimum of that the top surface 120a as circled by dotted-lines, the middle plane of the photo-sensitive layer 120 should be descended in a small scale based on the measurement to such local minimum. As shown in FIG. 4, the top surface 118a of the semiconductor substrate 118 is lower than that shown in FIG. 5 by a step height C, the middle plane of the photo-sensitive layer 120 should be descended in a comparable scale to the step height C based on the measurement to the top surface 118a of the semiconductor substrate 118. Therefore the substrate stage 112 should be raised in order to render the focal plane on the middle plane of the photo-sensitive layer 120.

Referring to FIG. 5, FIG. 5 is a schematic view of the transceiver module 102, in accordance with some embodiments of the present disclosure. FIG. 5 illustrates a condition when the transceiver module 102 moves from the left side, as shown in FIG. 4, to the right side of the semiconductor substrate 118. Similarly, the acoustic transceiver 124 may be used to obtain a distance information including a distance between the acoustic transceiver 124 and the top surface 120a along the scanning direction. Meanwhile, the optical transceiver 122 may be used to obtain a distance information including a distance between the optical transceiver 122 and the top surface 118a along the scanning direction. After obtaining the distance information based on the measurement of the acoustic transceiver 124 and the optical transceiver 122 and transmitting such distance information to the processing unit 114, the processing unit 114 may calculate a vertical displacement profile based on such distance information to further actuate the substrate stage 112.

In a position at a local maximum of that the top surface 120a as circled by dotted-lines, the middle plane of the photo-sensitive layer 120 is raised by a small scale. As shown in FIG. 5, the top surface 118a of the semiconductor substrate 118 is higher than that shown in FIG. 4 by a step height C. The middle plane of the photo-sensitive layer 120 should be raised in a comparable scale to the step height C based on the measurement to the top surface 118a of the semiconductor substrate 118. Therefore the substrate stage 112 should be descended in order to render the focal plane on the middle plane of the photo-sensitive layer 120.

Figure 6:
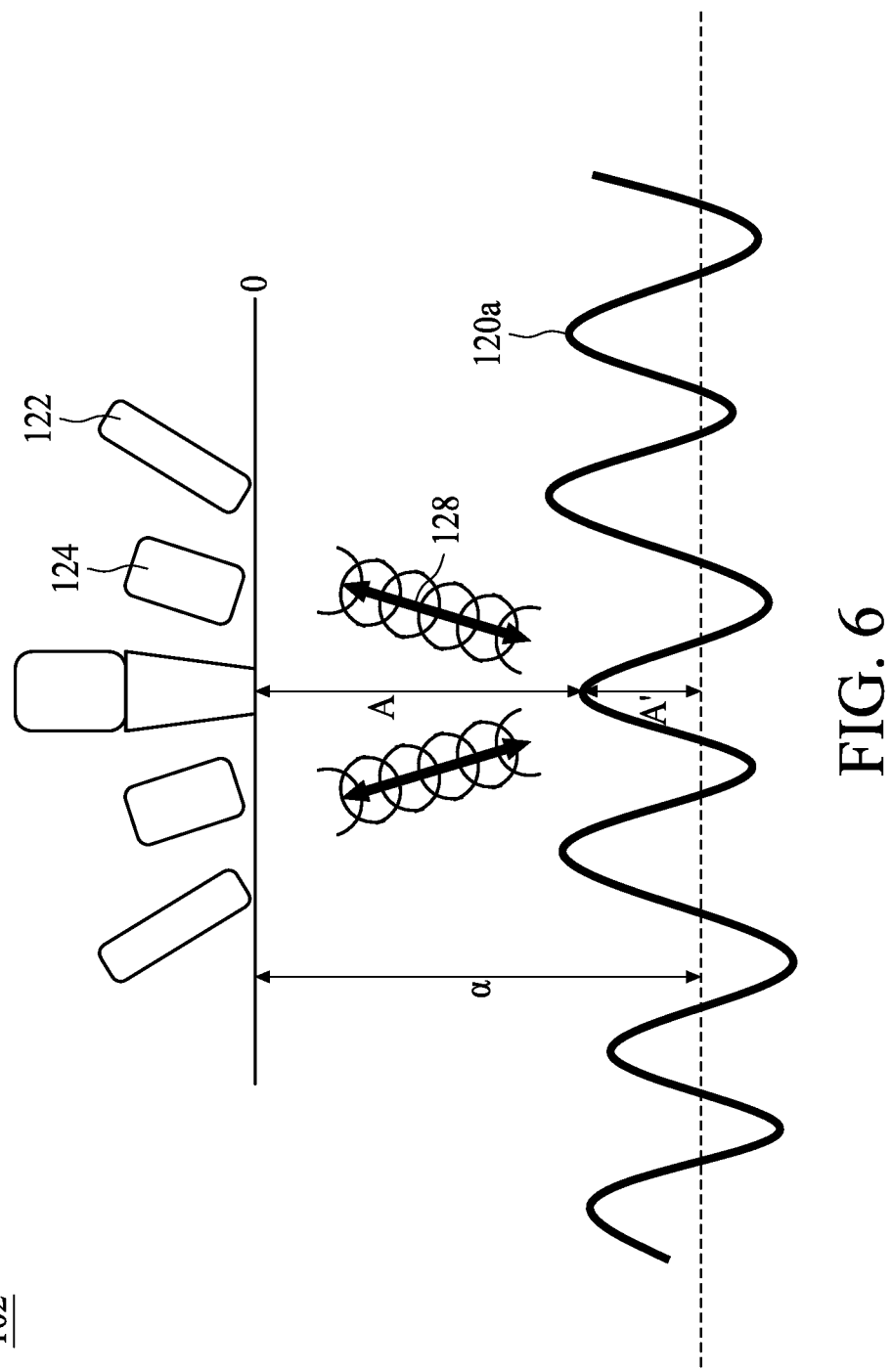

Referring to FIG. 6, FIG. 6 is a schematic view of the transceiver module 102, in accordance with some embodiments of the present disclosure. In some embodiments, the length A is obtained for further calculating the length A' by subtracting the length A from the length α.

In some embodiments, the length α is predetermined and can be defined or inputted to the processing unit 114 as the distance between the baseline (0) and the average level of the top surface 120a. On the other hand, the length A is defined as the distance between the baseline and the measured level of the top surface 120a. Since the top surface 120a has an uneven profile, the length A may vary along the scanning operation. The length A' is defined as the distance between the average level and the measured level of the top surface 120a.

In some embodiments, the length A can be measured by emitting and receiving a matter wave through the acoustic transceiver 124. The length A' can be by obtained by subtracting the length A from the length α. With the information including length A', the locations of the substrate stage 112 can be adjusted according to the topography of the top surface 120a, and keep the middle plane of the photo-sensitive layer 120 aligning with the focal plane accurately along the scanning direction.

Figure 7:
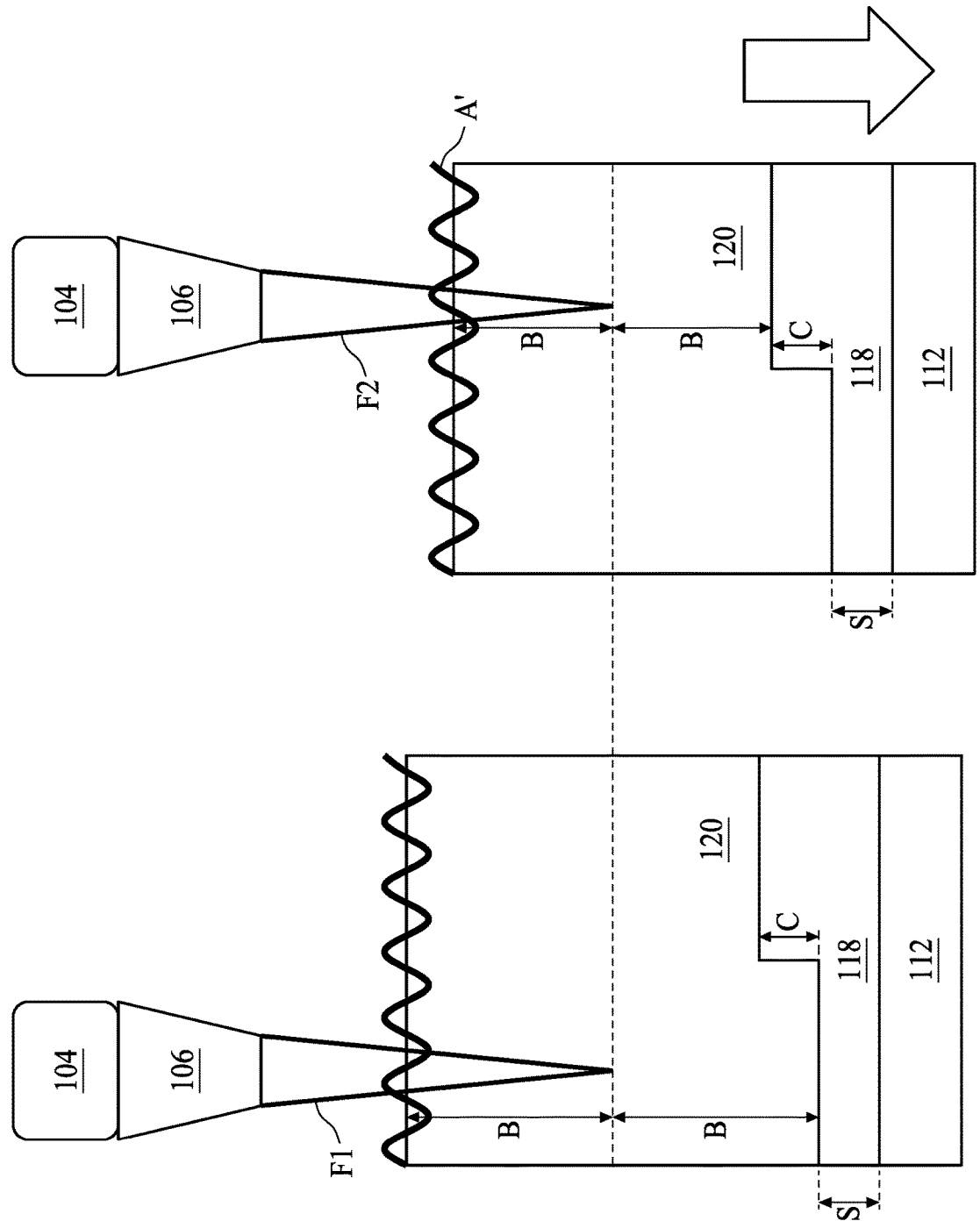
FIG. 7 is a schematic view illustrating an operation for manufacturing a semiconductor structure, in accordance with some embodiments of the present disclosure.

Referring to FIG. 7, FIG. 7 is a schematic view illustrating an operation for manufacturing a semiconductor structure, in accordance with some embodiments of the present disclosure. As shown in FIG. 7, the light source 104 and illumination module 106 scan the semiconductor substrate 118 from the left to the right. Based on the distance information previously addressed, including but not limited to, a distance between the optical transceiver and a top surface of the semiconductor substrate and a distance between the acoustic transceiver and a top surface of the photo-sensitive layer, the substrate stage 112 descends in a greater scale perspective but with smaller scale oscillation while the scanning takes place from the left to the right. As shown in FIG. 7, the focal length F1 rendered by the light source 104 and illumination module 10 is kept substantially the same as the focal length F2. Under such condition, the substrate stage 112 moves according to the instruction from the processing unit 114.

Figure 8:
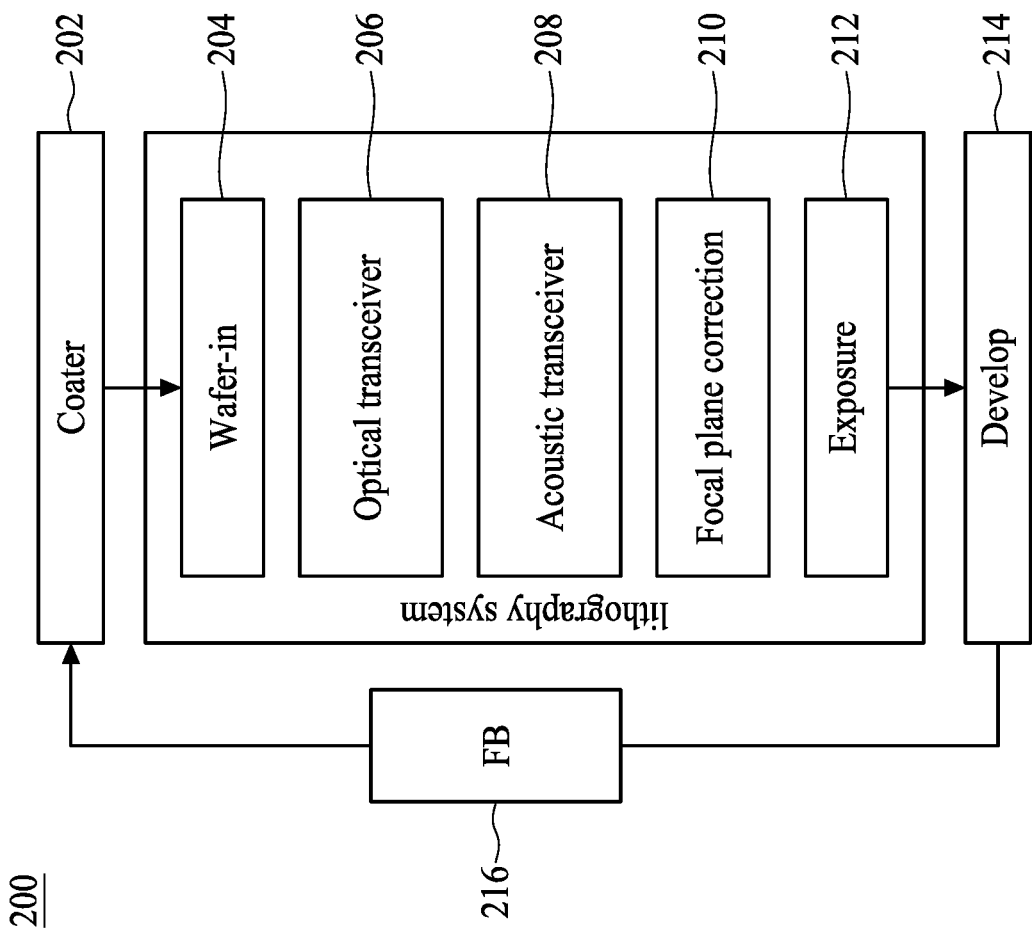
FIG. 8 is a block diagram illustrating a method for manufacturing a semiconductor structure, in accordance with some embodiments of the present disclosure.

Referring to FIG. 8, FIG. 8 is a block diagram illustrating a method 200 for manufacturing a semiconductor structure, in accordance with some embodiments of the present disclosure. The method 200 is described with reference to FIGS. 1 to 6.

The method 200 begins at operation 202, a coater, which forms the photo-sensitive layer 120 on the first surface 118a of the semiconductor substrate 118. Suitable materials of the photo-sensitive layer 120 and the semiconductor substrate 118 can be referred to the descriptions according to FIG. 2.

The method 200 moves to operation 204, wherein the semiconductor substrate 118 is received by a lithography system 100 for an exposuring operation.

The method 200 then moves to operation 206, obtaining the first profile of the first surface 118a. The first profile can be obtained by scanning the semiconductor substrate 118 under the light emitted from the optical transceiver 122 along a scanning direction. The light may be transparent to the photo-sensitive layer 120. The spot size of the optical transceiver 122 may greater than 1 micro meter. The first profile may include the distance information between the optical transceiver 122 and the first surface 118a.

The method 200 then moves to operation 208, obtaining the second profile of the top surface 120a of the photo-sensitive layer 120. The second profile can be obtained by scanning the photo-sensitive layer 120 under the matter wave emitted from the acoustic transceiver 124 along a scanning direction. The matter wave may be reflected from a top surface of the photo-sensitive layer 120. The matter wave may have a frequency less than about 500 megahertz. The second profile may include the distance information between the acoustic transceiver 124 and the top surface 120a of the photo-sensitive layer 120. In some embodiments, the operation 206 and operation 208 can be executed simultaneously.

The method 200 then moves to operation 210, the processing unit 114 calculates a vertical displacement profile based on first profile and the second profile. The processing unit 114 generates the control signal to control the substrate stage 112 and to compensate the thickness variations of the semiconductor substrate 118 and the photo-sensitive layer 120.

The method 200 then moves to operation 212, exposing the photo-sensitive layer 120 to the radiation emitted from the light source 104. The radiation may be capable of cross-linking the photo-sensitive layer 120. The substrate stage 112 may be descended, raised, or displaced in other directions according to the control signal from the processing unit 114 while exposing the photo-sensitive layer 120 to the radiation along the scanning direction.

The method 200 then moves to operation 214, developing the photo-sensitive layer 120. In some embodiments, the exposed semiconductor wafer is removed from lithography system and enters a developing stage. A developing liquid known in the arts may be used in this operation. Since the focal plane is controlled to adhere to the middle plane of the photo-sensitive layer 120 based on the operation of present disclosure, the photo-sensitive layer 120 is prevented from being over focus or under focus. A desired pattern of the photo-sensitive layer 120 after development can be obtained.

The method 200 further includes operation 216, where information associated to the post-development pattern may feedback to the coater for further improving during the coating operation. In some embodiments, the information associated to the post-development pattern may feedback to other operations may or may not illustrated in FIG. 8.

Some embodiments of the present disclosure provide a method for manufacturing a semiconductor structure. The method includes forming a photo-sensitive layer on a first surface of a semiconductor substrate. The photo-sensitive layer has a top surface. The method also includes obtaining a first profile of the first surface of the semiconductor substrate, and obtaining a second profile of the top surface of the photo-sensitive layer. The method also includes calculating a vertical displacement profile of the semiconductor substrate according to the first profile and the second profile.

Some embodiments of the present disclosure provide a method for manufacturing a semiconductor structure. The method includes forming a photo resist layer on a first surface of a semiconductor substrate. The photo resist layer has a top surface. The method also includes obtaining a first profile of the first surface of the semiconductor substrate through an optical transceiver, and obtaining a second profile of the top surface of the photo resist layer through an acoustic transceiver. The first profile and the second profile are measured simultaneously.

Some embodiments of the present disclosure provide an apparatus for manufacturing a semiconductor structure. The apparatus includes an optical transceiver connected to a processing unit, and an acoustic transceiver connected to the optical transceiver and the processing unit. The apparatus also includes a stage under the optical transceiver and the acoustic transceiver. The stage is connected to the processing unit. The optical transceiver emits a light transparent to a polymeric material, and the acoustic transceiver emits a matter wave reflected by the polymeric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for manufacturing a semiconductor structure, comprising:
   a stage;
   an optical transceiver over the stage, configured to obtain a first profile of a first surface of a substrate;
   an acoustic transceiver over the stage, configured to obtain a second profile of a top surface of a photosensitive layer over the substrate, wherein the stage is adapted to be displaced based on the first profile and the second profile.

2. The apparatus of claim 1, wherein the first profile and the second profile are measured simultaneously.

3. The apparatus of claim 1, wherein the optical transceiver and the acoustic transceiver are disposed at a substantially same level.

4. The apparatus of claim 1, wherein the stage is displaced in a vertical direction.

5. The apparatus of claim 1, further comprising a light source over the stage.

6. The apparatus of claim 5, wherein the stage is displaced in a vertical direction and the light source is displaced in a horizontal direction during a portion of a photolithographic exposure operation.

7. The apparatus of claim 5, wherein a focal length of the light source is constant during a portion of a photolithographic exposure operation.

8. The apparatus of claim 1, wherein the acoustic transceiver is adapted to emit a matter wave having a frequency less than about 500 megahertz.

9. The apparatus of claim 1, further comprising a mask supporter over the stage.

10. An apparatus for manufacturing a semiconductor structure, comprising:
    a stage, adapted to receive a substrate;
    a first optical transceiver facing the stage;
    a first acoustic transceiver facing the stage;
    a light source over the stage; and
    a processing unit electrically connected with the stage, the first optical transceiver, and the first acoustic transceiver.

11. The apparatus of claim 10, wherein the first optical transceiver and the first acoustic transceiver are disposed at a substantially same level.

12. The apparatus of claim 10, further comprising a second optical transceiver over the stage, wherein the first optical transceiver and the second optical transceiver are disposed at a substantially same level.

13. The apparatus of claim 10, further comprising a second acoustic transceiver over the stage, wherein the first acoustic transceiver and the second acoustic transceiver are disposed at a substantially same level.

14. The apparatus of claim 10, wherein the light source is an extreme ultraviolet (EUV) light source.

15. The apparatus of claim 10, wherein a focal length of the light source is constant during a photolithographic exposure operation.

16. The apparatus of claim 10, wherein the first acoustic transceiver is configured to emit a matter wave having a frequency less than about 500 megahertz.

17. An apparatus for manufacturing a semiconductor structure, comprising:
    an optical transceiver, connected to a processing unit;
    an acoustic transceiver, connected to the optical transceiver and the processing unit; and
    a stage under the optical transceiver and the acoustic transceiver, and connected to the processing unit,
    wherein the optical transceiver emits a light transparent to a polymeric material, and the acoustic transceiver emits a matter wave reflected by the polymeric material.

18. The apparatus of claim 17, further comprising a plurality of optical transceivers and a plurality of acoustic transceivers.

19. The apparatus of claim 17, further comprising a light source capable of cross-linking the polymeric material.

20. The apparatus of claim 17, wherein the optical transceiver and the acoustic transceiver are leveled with a baseline.

* * * * *